US011575995B2

(12) United States Patent
Yeh

(10) Patent No.: US 11,575,995 B2
(45) Date of Patent: Feb. 7, 2023

(54) SEMICONDUCTOR PACKAGE DEVICE AND METHOD FOR MANUFACTURING THE SAME

(71) Applicant: Advanced Semiconductor Engineering, Inc., Kaohsiung (TW)

(72) Inventor: Chang-Lin Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/244,885

(22) Filed: Apr. 29, 2021

(65) Prior Publication Data

US 2022/0353619 A1 Nov. 3, 2022

(51) Int. Cl.
| H04R 19/00 | (2006.01) |
| H04R 19/02 | (2006.01) |
| B81B 7/00 | (2006.01) |
| B81C 1/00 | (2006.01) |
| H04R 1/02 | (2006.01) |
| H04R 31/00 | (2006.01) |
| H04R 7/04 | (2006.01) |

(52) U.S. Cl.
CPC ........... *H04R 19/02* (2013.01); *B81B 7/0061* (2013.01); *B81C 1/00309* (2013.01); *H04R 1/025* (2013.01); *H04R 7/04* (2013.01); *H04R 31/00* (2013.01); *B81B 2201/0257* (2013.01); *B81B 2203/0127* (2013.01); *B81C 2201/0105* (2013.01); *H04R 2201/003* (2013.01)

(58) Field of Classification Search
CPC .......... H04R 19/02; H04R 1/025; H04R 7/04; H04R 31/00; H04R 2201/003; B81B 7/0061; B81B 2201/0257; B81B 2203/0127; B81C 1/00309; B81C 2201/0105

See application file for complete search history.

(56) References Cited

U.S. PATENT DOCUMENTS

| 10,932,032 B2 | 2/2021 | Huang | |
| 2018/0297834 A1* | 10/2018 | Renaud-Bezot | B81B 7/0061 |
| 2019/0270639 A1* | 9/2019 | Lorenz | B81B 3/0018 |

OTHER PUBLICATIONS

U.S. Appl. No. 16/917,335, filed Jun. 30, 2020, Kuo et al.

* cited by examiner

*Primary Examiner* — Matthew A Eason
(74) *Attorney, Agent, or Firm* — Foley & Lardner LLP

(57) ABSTRACT

A semiconductor package device and a method of manufacturing a semiconductor package device are provided. The semiconductor package device includes a substrate, a first electronic component, and an encapsulation layer. The substrate has a first surface, a second surface opposite to the first surface, and a first opening extending from the first surface to the second surface. The first electronic component is disposed on the first surface of the substrate. The encapsulation layer is formed on the second surface of the substrate. The encapsulation layer includes a chamber connected to the first opening, and a width of the first opening is smaller than a width of the chamber.

17 Claims, 21 Drawing Sheets

SEMICONDUCTOR PACKAGE DEVICE AND METHOD FOR MANUFACTURING THE SAME

BACKGROUND

1. Field of the Disclosure

The present disclosure relates to a semiconductor package device and a method for manufacturing the same, and to a semiconductor package device including an electronic component, and a method for manufacturing the same.

2. Description of the Related Art

Along with the advance of the packaging technology, MEMS devices, which responses to environment via micro sensors and micro actuators, have been integrated into various types of packages. As the size of the packages decreases, the challenges of integrating MEMS devices and dies/chips into a package increase as well. In addition, it is difficult to achieve both miniaturization of package size and excellent acoustic performance.

SUMMARY

In some embodiments, a semiconductor package device includes a substrate, a first electronic component, and an encapsulation layer. The substrate has a first surface, a second surface opposite to the first surface, and a first opening extending from the first surface to the second surface. The first electronic component is disposed on the first surface of the substrate. The encapsulation layer is formed on the second surface of the substrate. The encapsulation layer includes a chamber connected to the first opening, and a width of the first opening is smaller than a width of the chamber.

In some embodiments, a semiconductor package device includes a substrate, a microelectromechanical systems (MEMS) device, an encapsulation layer, and a chamber. The substrate has a first surface and a second surface opposite to the first surface. The MEMS device is disposed on the first surface of the substrate and substantially aligned with a first opening extending through the substrate. The encapsulation layer is formed on the second surface of the substrate. The chamber is in the encapsulation layer and connected to the first opening. The chamber is configured to receive a sound wave from the MEMS device through the first opening.

In some embodiments, a method of manufacturing a semiconductor package device, including: forming a sacrificial layer on a first surface of a substrate; forming an encapsulation layer on the first surface of the substrate and encapsulating the sacrificial layer; exposing the sacrificial layer by forming an opening in the substrate; and removing a portion of the sacrificial layer to define a chamber within the encapsulation layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
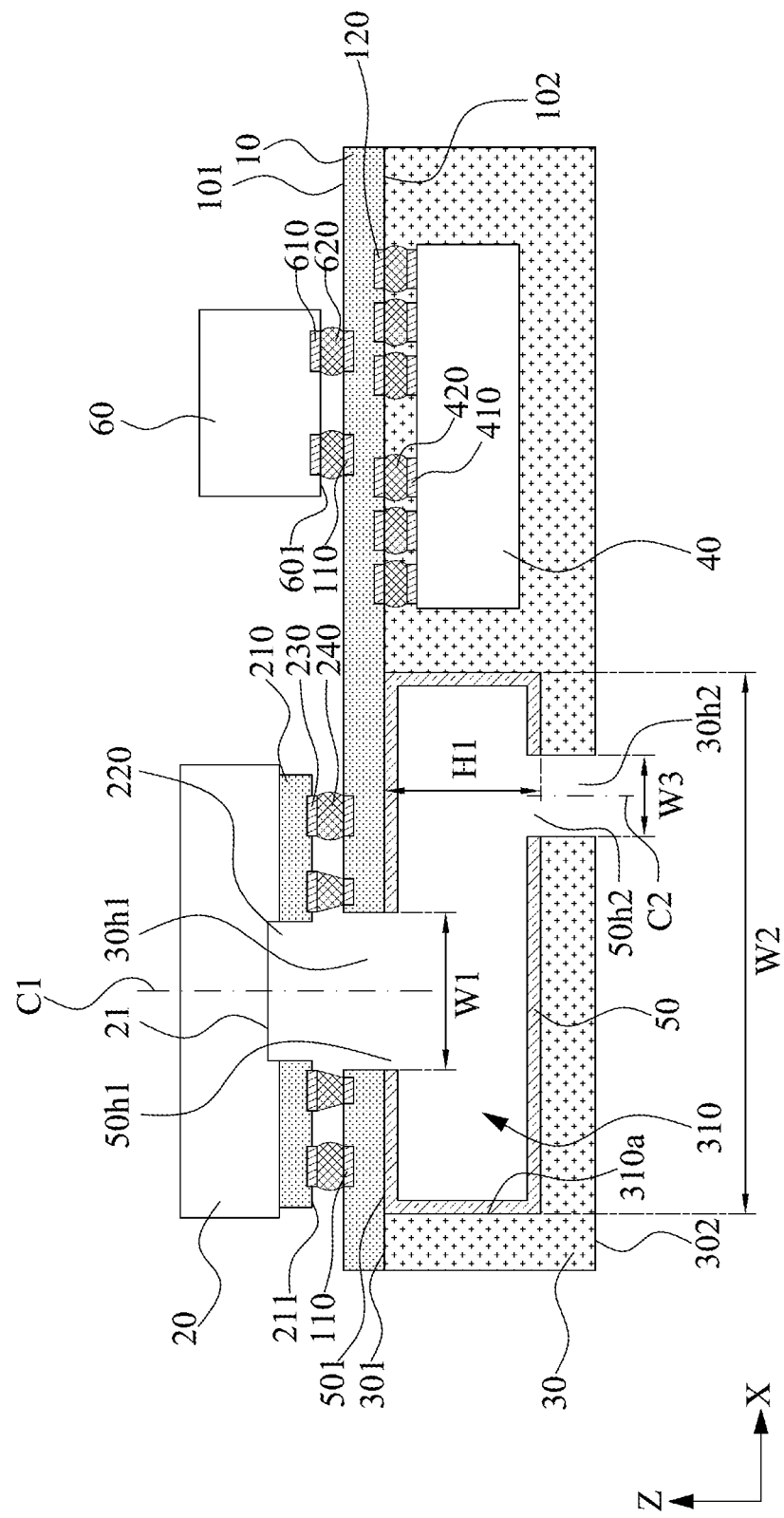
FIG. 1 illustrates a cross-sectional view of a semiconductor package device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In consumer electronics, conventional acoustic chamber design in a speaker (for example, an ear phone) typically integrate with the external case of the speaker. It is the spatial design of the external case that enhances the frequency response, and hence the size of the speaker can be larger than desired. In addition, the sound reflection caused by the external case is unsatisfactory, leading to unflattens and distortion of the frequency response. Selected material for the external case has to be used to resolve the aforesaid problem, however, inevitably increase the production cost.

Conventional package for speaker (e.g., ear phone) lacks an acoustic chamber, and the sound reflection seriously deteriorate acoustic performance. A new package structure for the speaker which could provide satisfactory acoustic performance, decrease the package size, and lower the production cost is hence provided in the present disclosure.

FIG. 1 illustrates a cross-sectional view of a semiconductor package device 1 according to some embodiments of the present disclosure. The semiconductor package device 1 includes a substrate 10, electronic components 20, 40 and 60, an encapsulation layer 30, a chamber 310 (also referred to as "an acoustic chamber"), and an acoustic absorbing layer 50.

The substrate 10 has a surface 101, a surface 102 opposite to the surface 101, and an opening 30h1 (or "a through hole"). In some embodiments, the opening 30h1 extends through the substrate 10. In some embodiments, the opening 30h1 extends from the surface 101 to the surface 102 of the substrate 10. The substrate 10 may include one or more conductive pads 110 in proximity to, adjacent to, or embedded in and exposed at the surface 101 of the substrate 10. The substrate 10 may include a solder resist (not shown) on the surface 101 of the substrate 10 to fully expose or to expose at least a portion of the conductive pads 110 for electrical connections. The substrate 10 may include one or more conductive pads 120 in proximity to, adjacent to, or embedded in and exposed at the surface 102 of the substrate 10. The substrate 10 may include a solder resist (not shown) on the surface 102 of the substrate 10 to fully expose or to expose at least a portion of the conductive pads 120 for electrical connections. The substrate 10 may include, for example, a printed circuit board (PCB), such as a paper-based copper foil laminate, a composite copper foil laminate, or a polymer-impregnated glass-fiber-based copper foil laminate. The substrate 10 may include an interconnection structure, such as a plurality of conductive traces or a through via, electrically connected to the conductive pads 110 and/or the conductive pads 120.

The electronic component 20 may be disposed on the surface 101 of the substrate 10. In some embodiments, the electronic component 20 is substantially aligned with the opening 30h1 of the substrate 10. In some embodiments, the electronic component 20 includes an active side 21, and the active side 21 is configured to emit or transmit at least one signal (e.g., one or more sound waves). In some embodiments, the electronic component 20 includes a vibration membrane portion, and the vibration membrane portion is substantially aligned with the opening 30h1 of the substrate 10. In some embodiments, the vibration membrane portion is in proximity to, adjacent to, or embedded in the active side 21 of the electronic component 20. In some embodiments, an electrical signal is provided to drive the vibration membrane portion to vibrate and generate sound waves. In some embodiments, the electronic component 20 is a microelectromechanical system (MEMS) device. In some embodiments, the opening 30h1 is proximal to the MEMS device. In some embodiments, the MEMS device is a speaker.

In some embodiments, the electronic component 20 includes a substrate 210 having an opening 220 exposing the active side 21. In some embodiments, the substrate 210 may include one or more conductive pads 230 in proximity to, adjacent to, or embedded in and exposed at the surface 211 of the substrate 210 for electrical connection. In some embodiments, the electronic component 20 is connected to or bonded on the surface 101 of the substrate 10 through the conductive pads 230 bonded to the conductive pads 110 through a solder joint 240. In some embodiments, the electrical connection between the electronic component 20 and the substrate 10 may be attained by way of surface mount technology (SMT).

The encapsulation layer 30 may be formed or disposed on the surface 102 of the substrate 10. In some embodiments, a surface 301 of the encapsulation layer 30 is in direct or physical contact with the surface 102 of the substrate 10. In some embodiments, the encapsulation layer 30 includes a dielectric material. In some embodiments, the encapsulation layer 30 includes an encapsulating material. The encapsulating material may include an epoxy resin having fillers, a molding compound (e.g., an epoxy molding compound or other molding compound), polyimide, a phenolic compound or material, a material with a silicone dispersed therein, or a combination thereof.

In some embodiments, the chamber 310 (also referred to as "the acoustic chamber") is in the encapsulation layer 30 and connected to the opening 30h1. In some embodiments, the chamber 310 is configured to receive a signal from the electronic component 20 (or the MEMS device) through the opening 30h1. In some embodiments, the chamber 310 is defined by the surface 102 of the substrate 10 and the encapsulation layer 30. In some embodiments, a sidewall of the opening 30h1 is non-coplanar to an inner wall 310a of the acoustic chamber 310.

In comparative embodiments, an acoustic chamber is formed by an external housing or casing in which the MEMS device is disposed. However, the housing or casing may reflect the air waves emitted from the MEMS device, and the reflected waves may attenuate the emitted air waves. This can result in a lower efficiency of the acoustic performance and distortion of the frequency response. Moreover, the arrangement of the housing or casing can undesirably increase the overall size of the semiconductor package device.

In contrast, according to some embodiments of the present disclosure, the acoustic chamber 310 is formed embedded in the encapsulation layer 30 on which the electronic component 20 is disposed, such that the overall size of the semiconductor package device 1 can be reduced. In addition, the acoustic chamber 310 within the encapsulation layer 30 can block the reflected waves from joining and thereby attenuating the emitted air waves, thus the efficiency of the acoustic performance can be increased, and distortion of the frequency response of the semiconductor package device 1 can be reduced effectively. Moreover, according to some embodiments of the present disclosure, the encapsulation layer 30 has a lower modulus than that of a metallic housing or casing, and thus reflected air waves possibly formed within the acoustic chamber 310 may be absorbed by the encapsulation layer 30 more efficiently.

In some embodiments, a width W1 of the opening 30h1 is smaller than a width W2 of the chamber 310. In some embodiments, a ratio W1/W2 of the width W1 of the opening 30h1 to the width W2 of the chamber 310 is from about 0.25 to about 0.5. In some embodiments, the chamber 310 has a height H1 in a direction perpendicular to the substrate 10, and a ratio H1/W2 of the height H1 to the width W2 of the chamber 310 is less than 1.

In some embodiments, the encapsulation layer 30 may further have an opening 30h2 connected to the chamber 310. In some embodiments, the opening 30h2 is opposite to the opening 30h1 of the substrate 10. In some embodiments, the opening 30h2 is exposed from a surface 302 opposite to the surface 301 of the encapsulation layer 30. In some embodiments, the opening 30h2 is distal from the electronic component 20 (or the MEMS device). In some embodiments, the opening 30h1 of the substrate 10 is free from overlapping with a projection of the opening 30h2 on the substrate 10. In some embodiments, a central axis C1 of the opening 30h1 is offset from a central axis C2 of the opening 30h2. In some embodiments, the vibration membrane portion of the electronic component 20 is free from vertical alignment to the opening 30h2 of the encapsulation layer 30. In some embodiments, a width W3 of the opening 30h2 is smaller than the width W2 of the chamber 310. With the design of the width W3 of the opening 30h2 smaller than the width W2 of the chamber 310, the acoustic chamber 310 may define a relatively large space further connecting the external environment through a relatively small opening or channel (i.e., the opening 30h2), such that the cut-off frequency may be further lowered, and thus relatively sufficient low-frequency resonance can be provided.

Sound waves may be classified into low frequency regime, medium frequency regime, and high frequency regime, depending on the applications. While 20 Hz to 20,000 Hz forms the absolute borders of the human hearing range, human hearing is most sensitive in the 2000 Hz to 5000 Hz frequency range. Low frequency regime may be ranged between 20 Hz and 200 Hz or lower. Medium frequency regime may be ranged between 200 Hz and 2000 Hz. High frequency regime may be higher than 2000 Hz. According to some embodiments of the present disclosure, with the design of the opening 30h1 together with the opening 30h2, the cut-off frequency may be further lowered, and thus relatively sufficient low-frequency resonance can be provided. For example, the frequency response from about 200 Hz to about 400 Hz may be enhanced by virtue of the aforesaid opening design. Therefore, the acoustic performance (especially for relatively low-frequency resonance) of the semiconductor package device 1 can be increased. In addition, with the offset arrangement of the opening 30h1 and the opening 30h2, the length of air flows carrying the air waves can be increased, and thus the relatively low-frequency resonance of the generated sound waves can be improved.

In some embodiments, the electronic component 40 is embedded in the encapsulation layer 30. In some embodiments, the electronic component 40 is encapsulated in the encapsulation layer 30. In some embodiments, the electronic component 40 may include one or more conductive pads 410 in proximity to, adjacent to, or embedded in and exposed at a surface 401 of the electronic component 40 for electrical connection. In some embodiments, the electronic component 40 is connected to or bonded on the surface 102 of the substrate 10 through the conductive pads 410 bonded to the conductive pads 120 through a solder joint 420. In some embodiments, the electrical connection between the electronic component 40 and the substrate 10 may be attained by way of SMT. Alternatively, the electronic component 40 may be electrically connected to the substrate 10 by way of wire-bond techniques. In some embodiments, the electronic component 40 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. In some embodiments, the electronic component 40 may include, for example, a processor, a controller (e.g. a memory controller), a memory die, a power device, or a high speed input/output device.

In some embodiments, the acoustic absorbing layer 50 may be on the inner wall 310a of the chamber 310. In some embodiments, the acoustic absorbing layer 50 has an opening 50h1 that is aligned to the opening 30h1 of the substrate 10. In some embodiments, a surface 501 of the acoustic absorbing layer 50 is substantially coplanar with the surface 301 of the encapsulation layer 30. In some embodiments, the opening 30h1 of the substrate 10 and the opening 50h1 of the acoustic absorbing layer 50 in combined define the opening or channel of the chamber 310 that connects to the electronic component 20. In some embodiments, the acoustic absorbing layer 50 further has an opening 50h2 that is aligned to the opening 30h2. In some embodiments, the opening 30h2 of the encapsulation layer 30 and the opening 50h2 of the acoustic absorbing layer 50 in combined define the opening or channel of the chamber 310 that connects to the external environment. In some embodiments, the acoustic absorbing layer 50 may include an uneven thickness. In some embodiments, the inner wall of the opening 30h1 may be free of the acoustic absorbing layer 50. In some embodiments, the inner wall of the opening 30h2 may be free of the acoustic absorbing layer 50. According to some embodiments of the present disclosure, the acoustic absorbing layer 50 on the inner wall 310a of the acoustic chamber 310 is further advantageous to attenuation of reflected air waves possibly formed within the acoustic chamber 310. Therefore, the efficiency of the acoustic performance is further increased, and distortion of the frequency response of the semiconductor package device 1 can be reduced more effectively.

In some embodiments, the electronic component 60 is disposed on the surface 101 of the substrate 10. In some embodiments, the electronic component 60 may include one or more conductive pads 610 in proximity to, adjacent to, or embedded in and exposed at a surface 601 of the electronic component 60 for electrical connection. In some embodiments, the electronic component 60 is connected to or bonded on the surface 101 of the substrate 10 through the conductive pads 610 bonded to the conductive pads 110 through a solder joint 620. In some embodiments, the electrical connection between the electronic component 60 and the substrate 10 may be attained by way of SMT. Alternatively, the electronic component 60 may be electrically connected to the substrate 10 by way of wire-bond techniques. The electronic component 60 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

Figure 2:
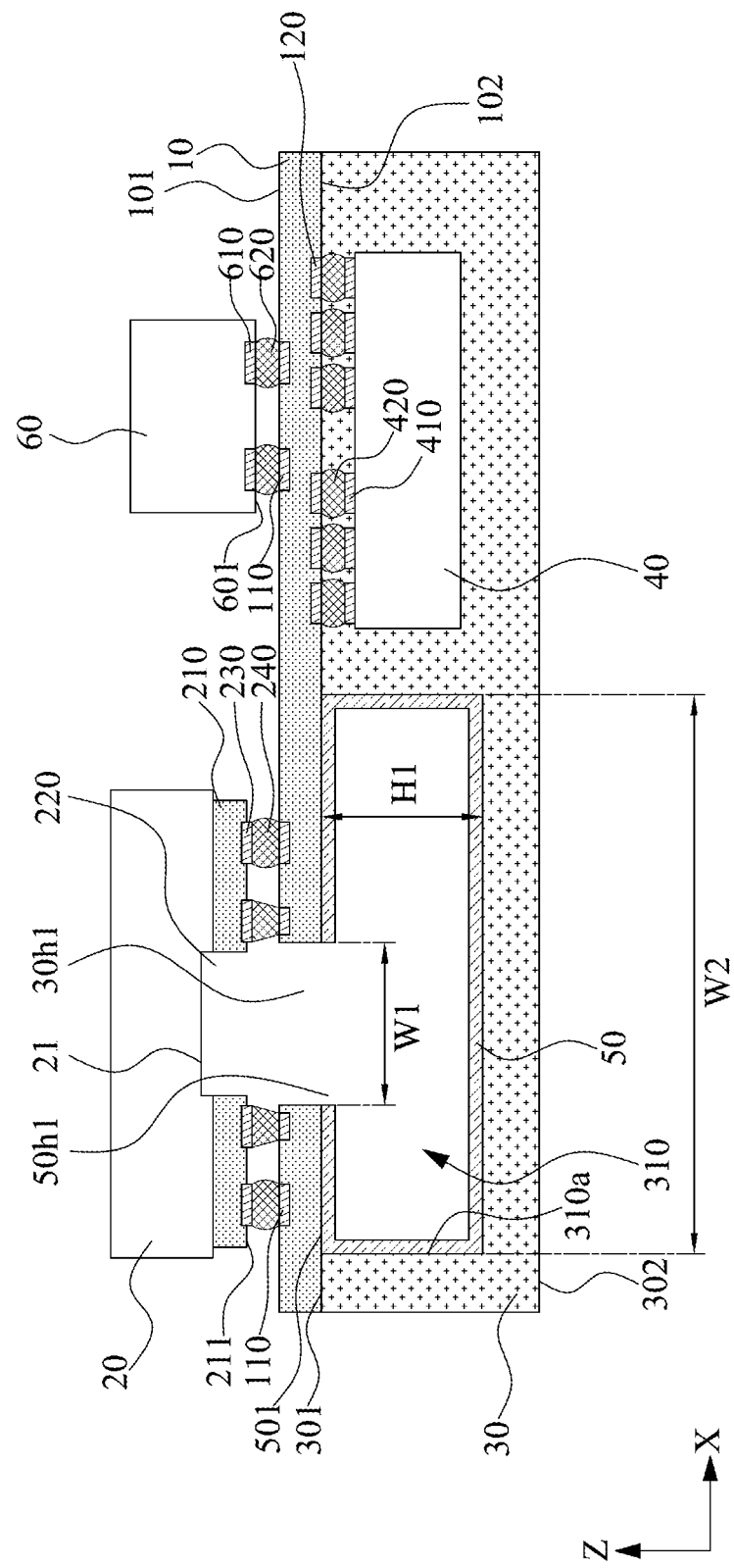
FIG. 2 illustrates a cross-sectional view of a semiconductor package device according to some embodiments of the present disclosure.

FIG. 2 illustrates a cross-sectional view of a semiconductor package device 2 according to some embodiments of the present disclosure. The semiconductor package device 2 is similar to the semiconductor package device 1 in FIG. 1, and the differences are as described below.

In some embodiments, the semiconductor package device 2 does not include an opening that is connected to the chamber 310 and opposite to the opening 30h1. In some embodiments, the chamber 310 (also referred to as "the acoustic chamber") is free from connecting to an external environment through an opening or a through hole. According to some embodiments of the present disclosure, with the aforesaid design, the decay of sound waves can be relatively slower.

Figure 3:
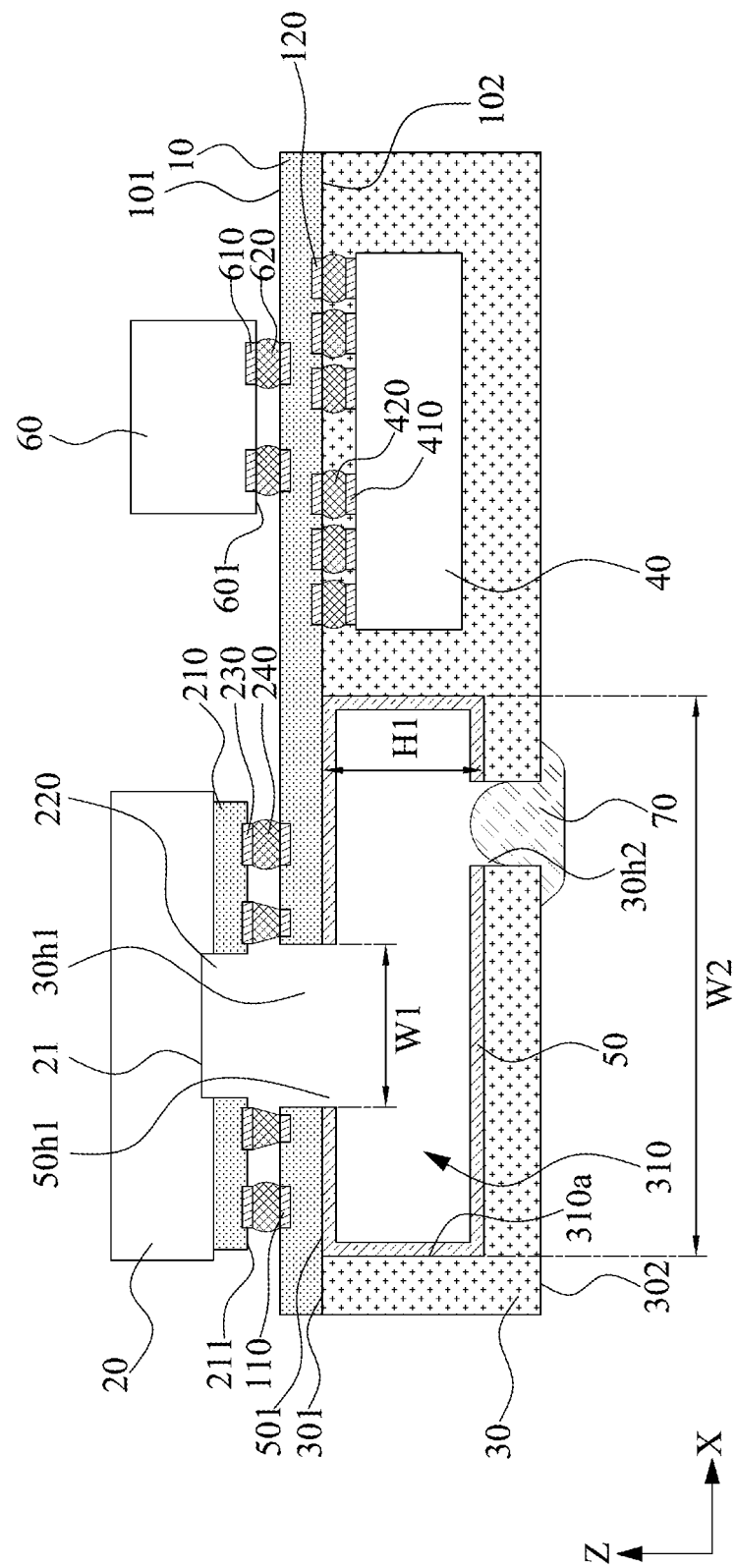
FIG. 3 illustrates a cross-sectional view of a semiconductor package device according to some embodiments of the present disclosure.

FIG. 3 illustrates a cross-sectional view of a semiconductor package device 3 according to some embodiments of the present disclosure. The semiconductor package device 3 is similar to the semiconductor package device 1 in FIG. 1, and the differences are as described below.

In some embodiments, the semiconductor package device 3 may further include a sealing material 70. In some embodiments, the sealing material 70 blocks the opening 30h2 of the encapsulation layer 30. In some embodiments, the sealing material 70 blocks the chamber 310 from connecting to an external environment through the opening 30h2. According to some embodiments of the present disclosure, with the aforesaid design, the decay of sound waves can be relatively slower. In some embodiments, the sealing material 70 may be or include an encapsulating material. The encapsulating material may include an epoxy resin having fillers, a molding compound (e.g., an epoxy molding compound or other molding compound), polyimide, a phenolic compound or material, a material with a silicone dispersed therein, or a combination thereof.

Figure 4:
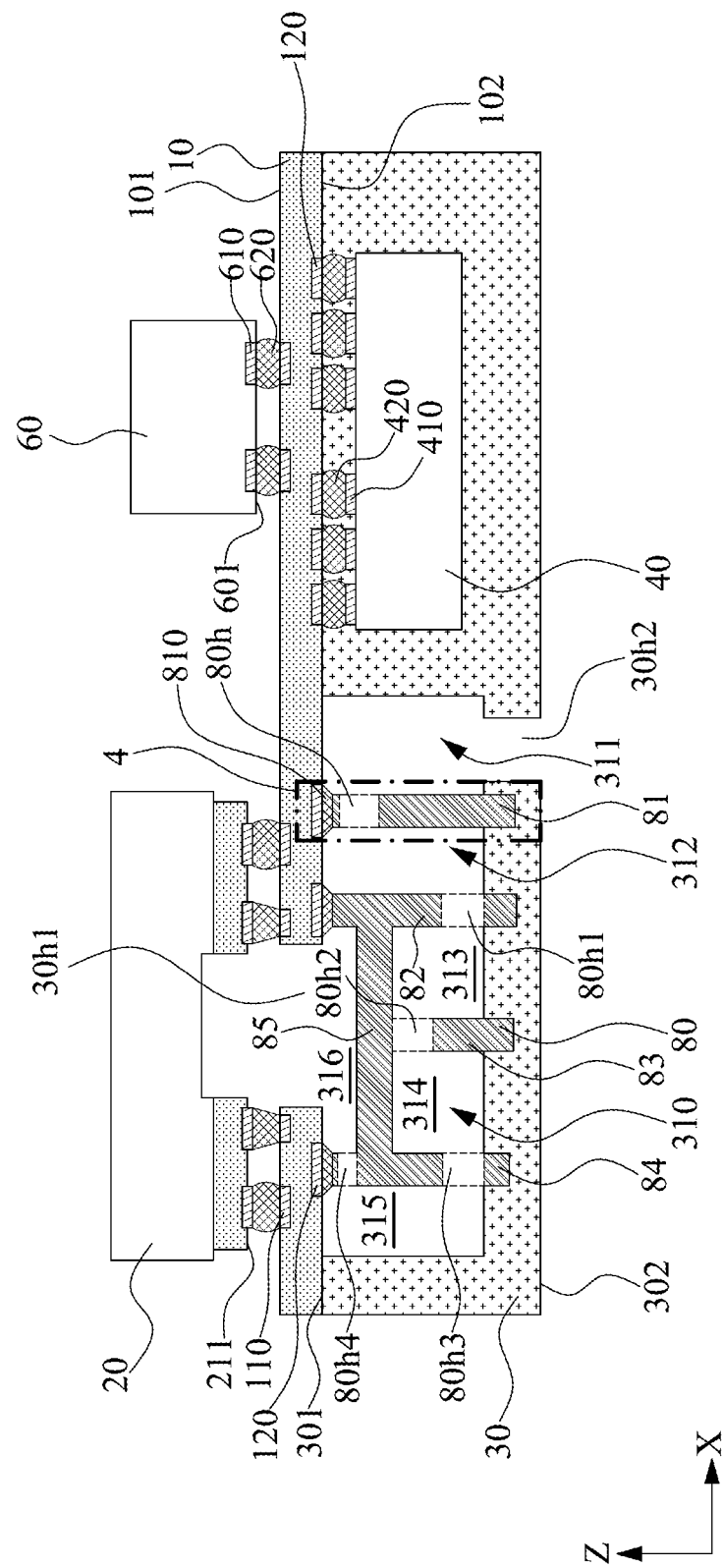
FIG. 4 illustrates a cross-sectional view of a semiconductor package device according to some embodiments of the present disclosure.

FIG. 4 illustrates a cross-sectional view of a semiconductor package device 4 according to some embodiments of the present disclosure. The semiconductor package device 4 is similar to the semiconductor package device 1 in FIG. 1, and the differences are as described below.

In some embodiments, the semiconductor package device 4 includes a sound wave path lengthening mechanism in the chamber 310 (also referred to as "the acoustic chamber"). In some embodiments, the sound wave path lengthening mechanism includes structure features that generate increased lengths of air flows carrying the air waves within the chamber 310. In some embodiments, the sound wave path lengthening mechanism includes a partition structure 80 or at least a portion of the partition structure 80.

In some embodiments, the partition structure 80 is disposed within the chamber 310 and divides the chamber 310 into a plurality of sub-chambers, such as sub-chambers 311 and 312. In some embodiments, the partition structure 80 includes a partition wall 81 having a through hole 80h connecting the sub-chamber 311 and the sub-chamber 312. According to some embodiments of the present disclosure, with the aforesaid design of dividing the chamber 310 into sub-chambers 311 and 312 through the partition structure 80, the air flows carrying the air waves enter the sub-chamber 312 and then enter the sub-chamber 311 through the through hole 80h, such that the path of the air waves is relatively less straight-forwarded, thereby the lengths of the total path of the air waves within the chamber 310 may be increased.

In some embodiments, the partition structure 80 may include a plurality of partition walls (e.g., partition walls 81, 82, 83, 84 and 85) each having one or more through holes (e.g., through holes 80h, 80h1, 80h2, 80h3 and 80h4). In some embodiments, the partition walls 82, 83, 84 and 85 form a partition sub-structure which is separated from the partition wall 81. In some embodiments, the plurality of partition walls and the plurality of through holes divide the chamber 310 into a plurality of sub-chambers (e.g., sub-chambers 311, 312, 313, 314, 315 and 316) connecting the opening 30h1 to the opening 30h2. According to some embodiments of the present disclosure, with the aforesaid design, the air flows carrying the air waves enter the sub-chambers 316, 315, 314, 313, 312, and 311 in order through the through holes 80h4, 80h3, 80h2, 80h1 and 80h, such that the air waves are travelling via relatively winding paths, thereby the lengths of the paths of the air waves within the chamber 310 may be further increased. Therefore, the relatively low-frequency resonance of the generated sound waves can be improved, and thus the relatively low-frequency acoustic performance can be improved.

In some embodiments, the partition structure 80 includes a metal material, a dielectric material, or a combination thereof. In some embodiments, the partition walls of the partition structure 80 include copper plates. In some embodiments, the partition structure 80 includes or is formed of a polymer material. According to some embodiments of the present disclosure, the partition structure 80 includes or is formed of a polymer material, such that reflected air waves possibly formed within the acoustic chamber 310 may be further absorbed by the partition structure 80 more efficiently.

In some embodiments, a portion of the partition structure 80 is embedded in the encapsulation layer 30. In some embodiments, the partition structure 80 is connected to the surface 102 of the substrate 10 through a solder joint 810. The connection between the partition structure 80 and the substrate 10 may be attained by way of SMT. According to some embodiments of the present disclosure, one end of the partition structure 80 is embedded in the encapsulation layer 30 without bonding to any pads, and thus only the other end of the partition structure 80 where the connection between the partition structure 80 and the substrate 10 is formed by SMT requires alignment to the bonded pads. That is, the partition structure 80 can be disposed in the chamber 310 of the encapsulation layer 30 without aligning to bonded pads on two opposite sides. Therefore, the arrangement and alignment of the partition structure 80 in the chamber 310 of the encapsulation layer 30 is relatively easy and highly accurate. In addition, forming the portion of the partition structure 80 embedded in the encapsulation layer 30 is compatible with the current processing operations, which is further advantageous to simplifying the manufacturing process as well as lowering the costs.

Figure 4B:
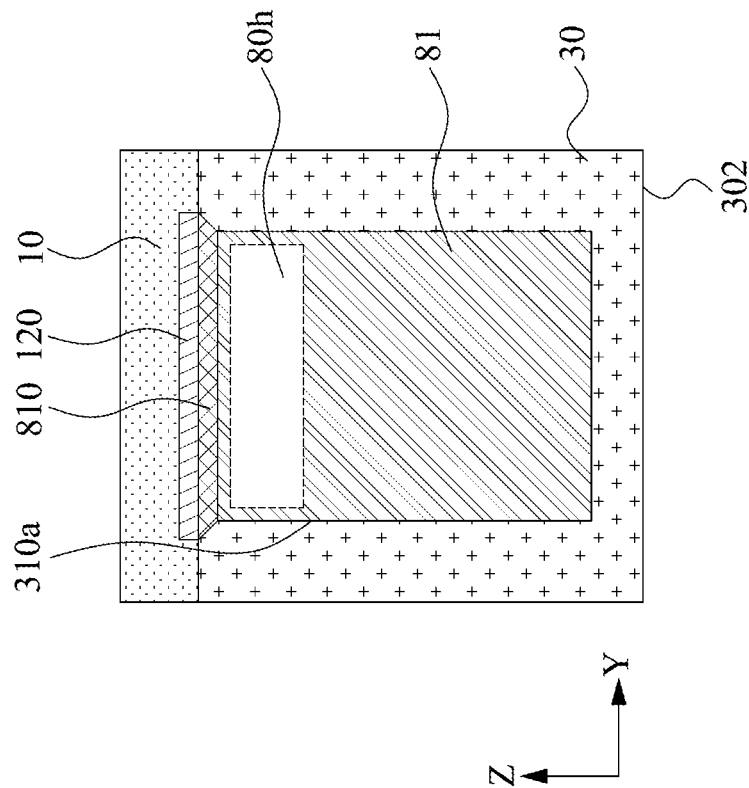
FIG. 4B illustrates an enlarged view of a dotted box 4 as shown in FIG. 4 according to some embodiments of the present disclosure.
Figure 4A:
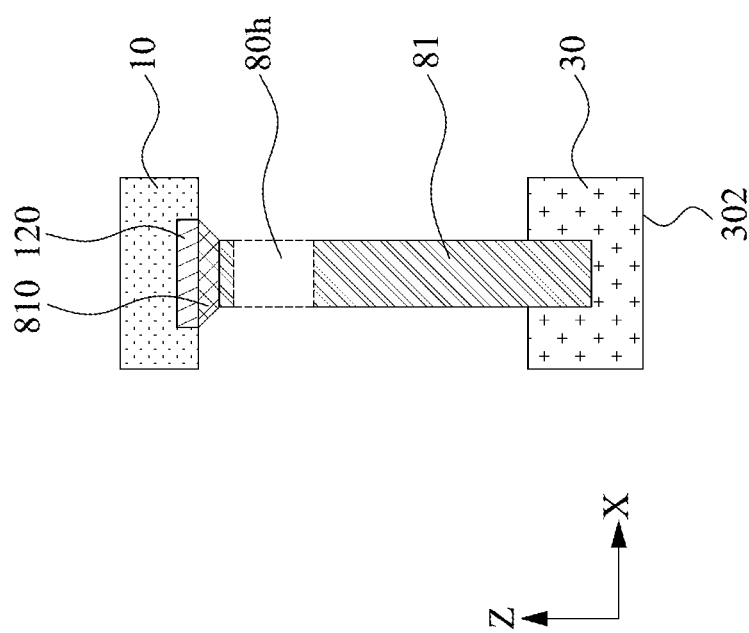
FIG. 4A illustrates an enlarged view of a dotted box 4 as shown in FIG. 4 according to some embodiments of the present disclosure.

FIG. 4A illustrates an enlarged view of a dotted box 4 as shown in FIG. 4 along the X-Z plane according to some embodiments of the present disclosure, and FIG. 4B illustrates an enlarged view of the dotted box 4 as shown in FIG. 4 along the Y-Z plane according to some embodiments of the present disclosure.

In some embodiments, the through hole 80h may penetrate through a portion of the partition wall 81. As shown in FIG. 4B, in some embodiments, the peripheral edge of the through hole 80h may be defined by the partition wall 81. In some embodiments, the partition wall 81 may directly contact the inner wall 310a of the chamber 310. In some embodiments, the chamber 310 surrounds and directly contacts the peripheral surfaces of the partition wall 81 so as to seal the partition wall 80 onto the chamber 310, and thus the air flows carrying the air waves are only allowed to pass through the through hole 80fh FIG. 5A, FIG. 5B, FIG. 5C, FIG. 5D, FIG. 5E, FIG. 5F, FIG. 5G, and FIG. 5H illustrate various operations in a method of manufacturing a semiconductor package device 1 in accordance with some embodiments of the present disclosure.

Figure 5A:
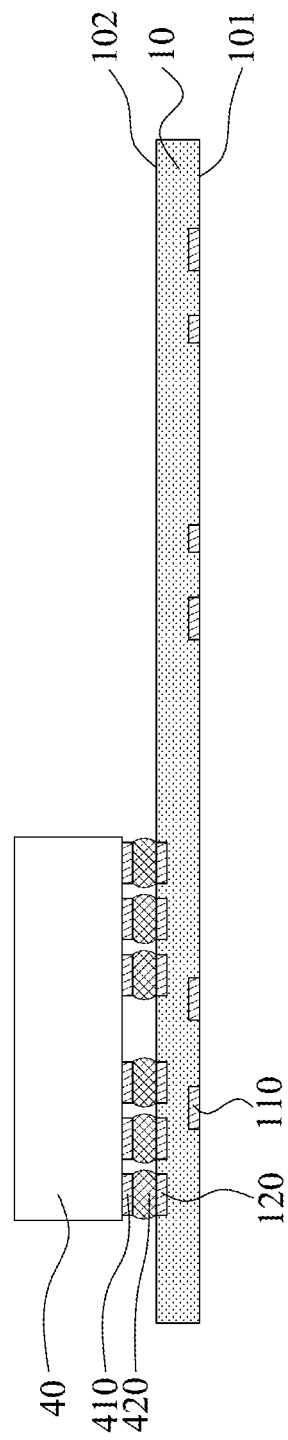
FIG. 5A, FIG. 5B, FIG. 5C, FIG. 5D, FIG. 5E, FIG. 5F, FIG. 5G, and FIG. 5H illustrate various operations in a method of manufacturing a semiconductor package device in accordance with some embodiments of the present disclosure.

Referring to FIG. 5A, a substrate 10 having a surface 101 and a surface 102 opposite to the surface 101 is provided, and an electronic component 40 is disposed on the surface 102 of the substrate 10. In some embodiments, the substrate 10 includes conductive pads 110 and 120. In some embodiments, the electronic component 40 is connected to or bonded on the surface 102 of the substrate 10 through conductive pads 410 bonded to the conductive pads 120 through a solder joint 420. In some embodiments, the electrical connection between the electronic component 40 and the substrate 10 may be attained by way of SMT.

Figure 5B:
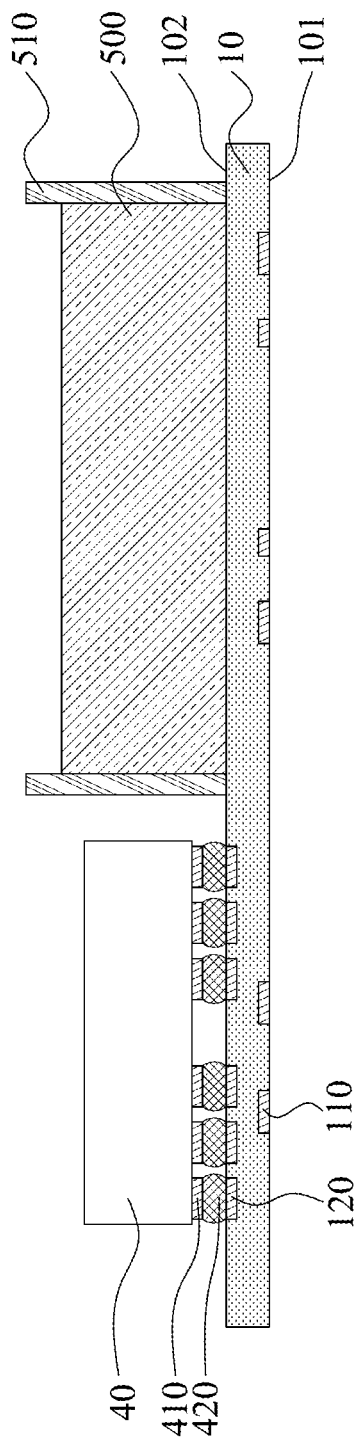

Referring to FIG. 5B, a sacrificial layer 500 is formed on the surface 102 of the substrate 10. In some embodiments, the sacrificial layer 500 covers a portion of the surface 102 of the substrate 10 and spaced apart from the electronic component 40. In some embodiments, the sacrificial layer 500 includes a gel composition capable of retaining a predetermined pattern on the surface 102 of the substrate 10 and configured to be soluble in a predetermined solvent. In some embodiments, the sacrificial layer 500 includes an aqueous gel. In some embodiments, the sacrificial layer 500 includes a gel soluble in an organic solvent. In some embodiments, the sacrificial layer 500 may be formed by the following operations.

In some embodiments, a limit structure 510 is disposed on the surface 102 of the substrate 10 prior to forming the sacrificial layer 500, and then a sacrificial material is disposed within a space defined by the limit structure 510 to form the sacrificial layer 500 within the space defined by the limit structure 510. In some embodiments, the sacrificial material may be or include an aqueous gel or a gel soluble in an organic solvent. Next, the sacrificial material may be cured to form the sacrificial layer 500 within the spaced defined by the limit structure 510, and then the limit structure 510 is removed. In some embodiments, the limit structure 510 may include molded plates or a patterned dry film. In some embodiments, the molded plates may be disposed on the surface 102 of the substrate 10 by way of SMT. In some embodiments, the patterned dry film may be disposed or formed on the surface 102 of the substrate 10 by coating or deposition, and the patterned dry film may be removed by stripping.

In some other embodiments, the sacrificial layer 500 may include a gel composition having a viscosity that is sufficient for it to retain a predetermined pattern of the sacrificial layer 500 on the surface 102 of the substrate 10 yet still remains a flowability suitable for the operation of disposing the sacrificial layer 500. In the present embodiments, the limit structure 510 may be omitted.

Figure 5C:
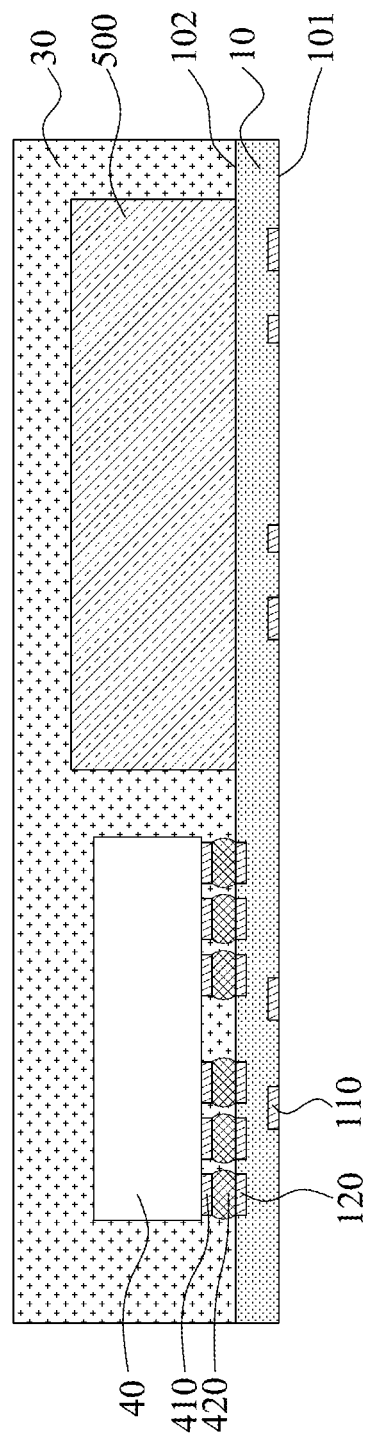

Referring to FIG. 5C, an encapsulation layer 30 is formed on the surface 102 of the substrate 10 and encapsulating the sacrificial layer 500. In some embodiments, the limit structure 510 is removed prior to forming the encapsulation layer 30. In some embodiments, the encapsulation layer 30 fully covers the sacrificial layer 500. In some embodiments, the encapsulation layer 30 encapsulates the electronic component 40. In some embodiments, the encapsulation layer 30 fully covers the electronic component 40. In some embodiments, the encapsulation layer 30 may be or include an encapsulating material. The encapsulating material may include an epoxy resin having fillers, a molding compound (e.g., an epoxy molding compound or other molding compound), polyimide, a phenolic compound or material, a material with a silicone dispersed therein, or a combination thereof.

Figure 5D:
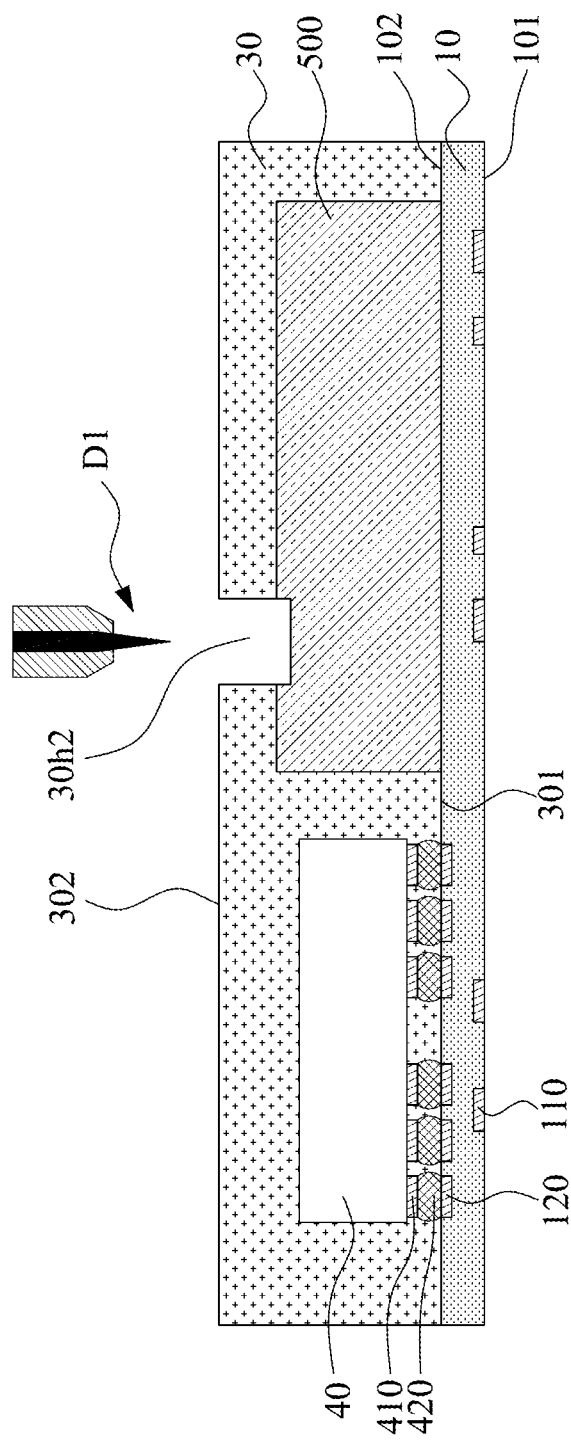

Referring to FIG. 5D, the sacrificial layer 500 is exposed by forming an opening 30*h*2 in the encapsulation layer 30 that exposes a portion of the sacrificial layer 500. In some embodiments, the sacrificial layer 500 is exposed by performing one or more drilling operations. In some embodiments, a drilling operation D1 may be performed on the encapsulation layer 30 to form the opening 30*h*2 that exposes a portion of the sacrificial layer 500.

Figure 5E:
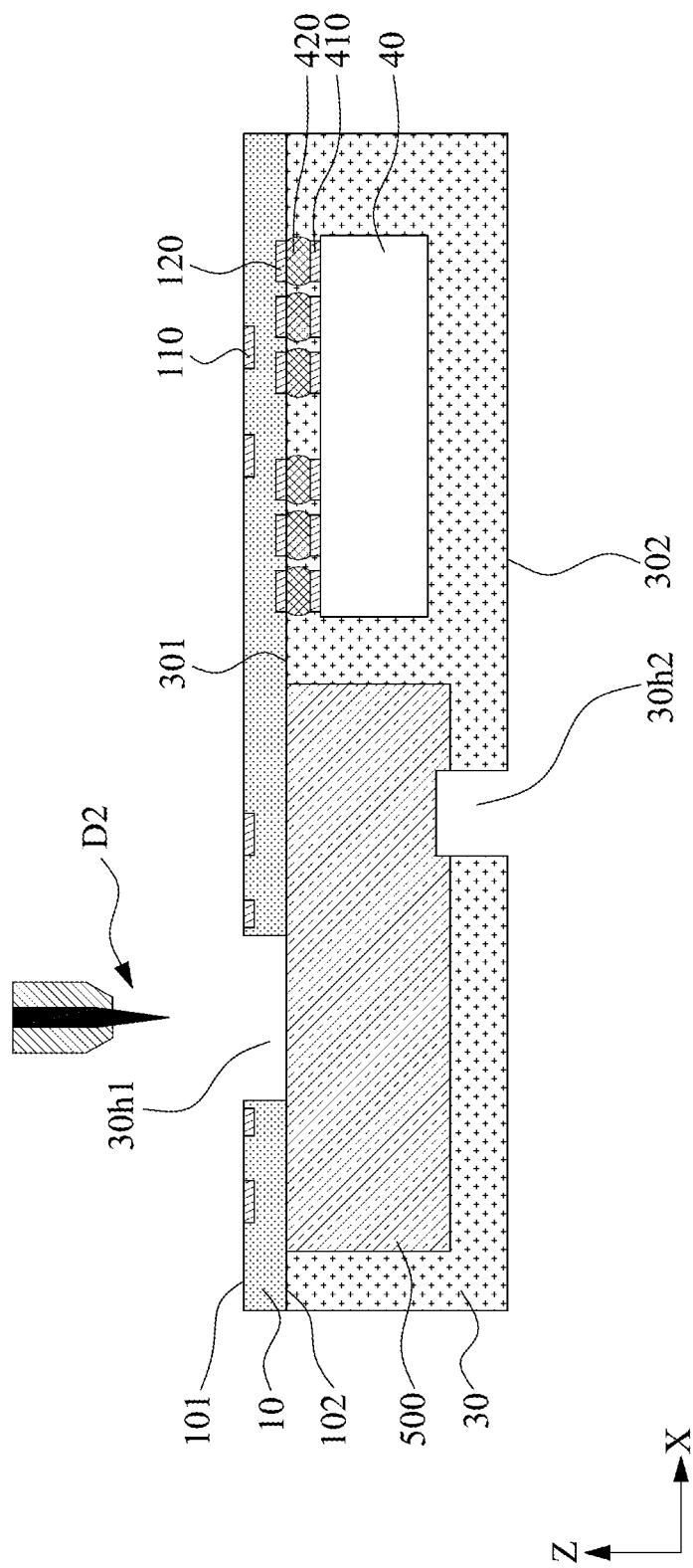

Referring to FIG. 5E, the sacrificial layer 500 is exposed by forming an opening 30*h*1 in the substrate 10. In some embodiments, the sacrificial layer 500 is exposed by performing a drilling operation D2 on the substrate 10 to form the opening 30*h*1 that exposes a portion of the sacrificial layer 500. In some embodiments, the drilling operation D2 is performed from the surface 101 of the substrate 10.

Figure 5F:
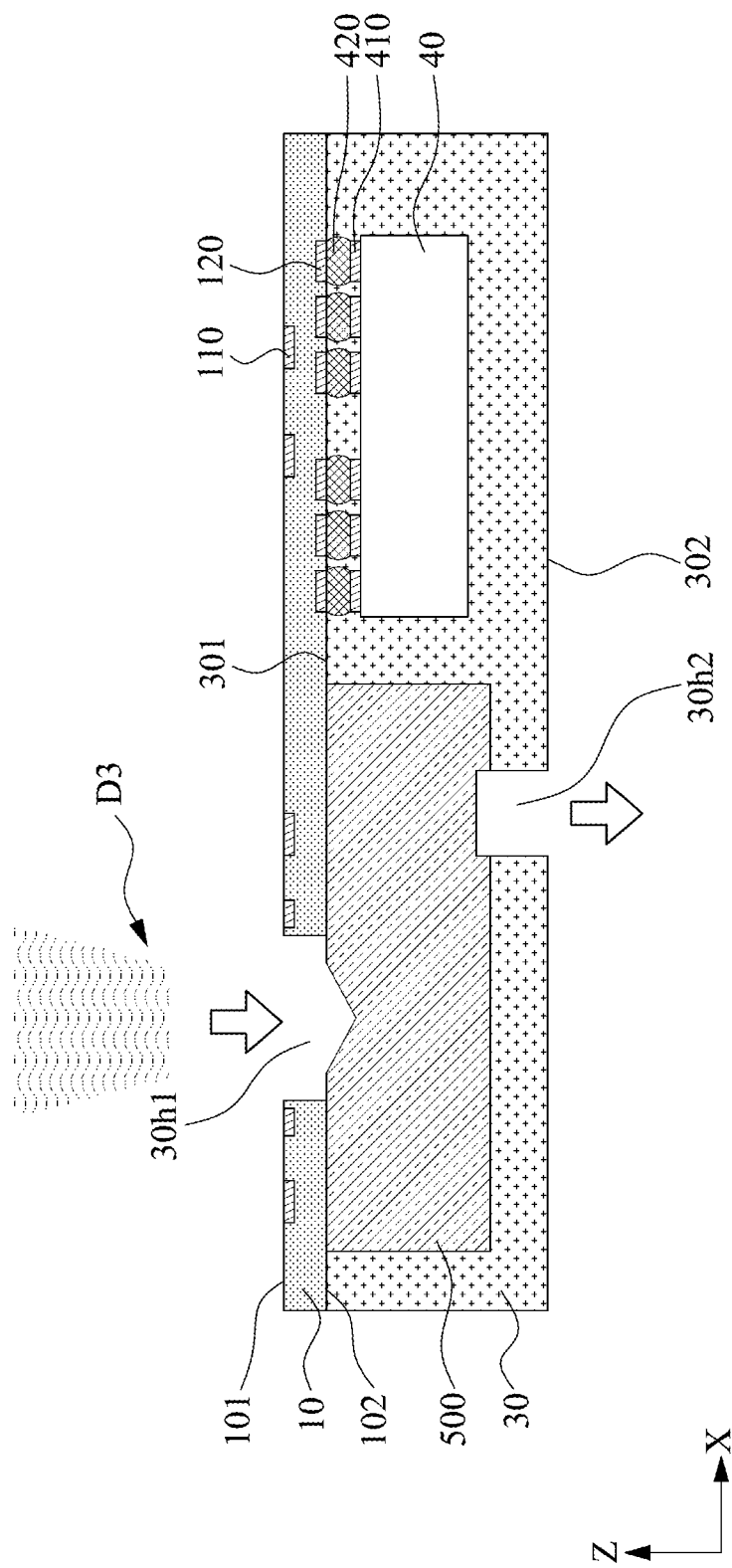

Referring to FIG. 5F, a removal operation D3 is performed on the sacrificial layer 500. In some embodiments, the removal operation D3 includes providing water or an organic solvent from the opening 30*h*1 and letting it contact and then dissolve a portion of the sacrificial layer 500. In some embodiments, the water or organic solvent carrying the dissolved materials of the sacrificial layer 500 flows out of the encapsulation layer 30 from the opening 30*h*2.

Figure 5G:
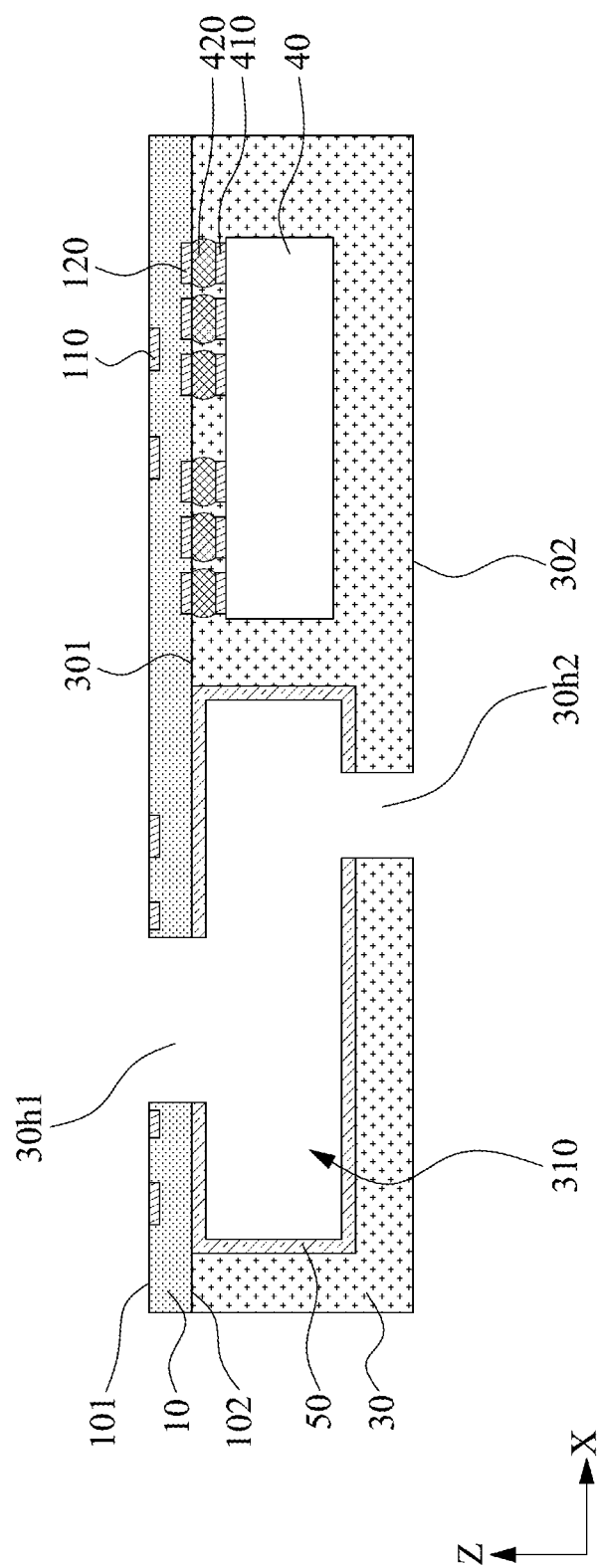

Referring to FIG. 5G, a portion of the sacrificial layer 500 is removed to define a chamber 310 within the encapsulation layer 30. In some embodiments, the chamber 310 is formed, a portion of the sacrificial layer 500 remains on an inner wall 310*a* of the chamber 310 to form an acoustic absorbing layer 50. In some embodiments, the acoustic absorbing layer 50 may include an uneven thickness.

In some other embodiments, an acoustic absorbing material may be coated on the exposed surfaces of the sacrificial layer 500 prior to forming the encapsulation layer 30, and the encapsulation layer 30 is formed on the acoustic absorbing material. After a portion of the sacrificial layer 500 is removed to define the chamber 310, the acoustic absorbing material may be between the encapsulation layer 30 and the acoustic absorbing layer 50 formed from the remained portion of the sacrificial layer 500.

Figure 5H:
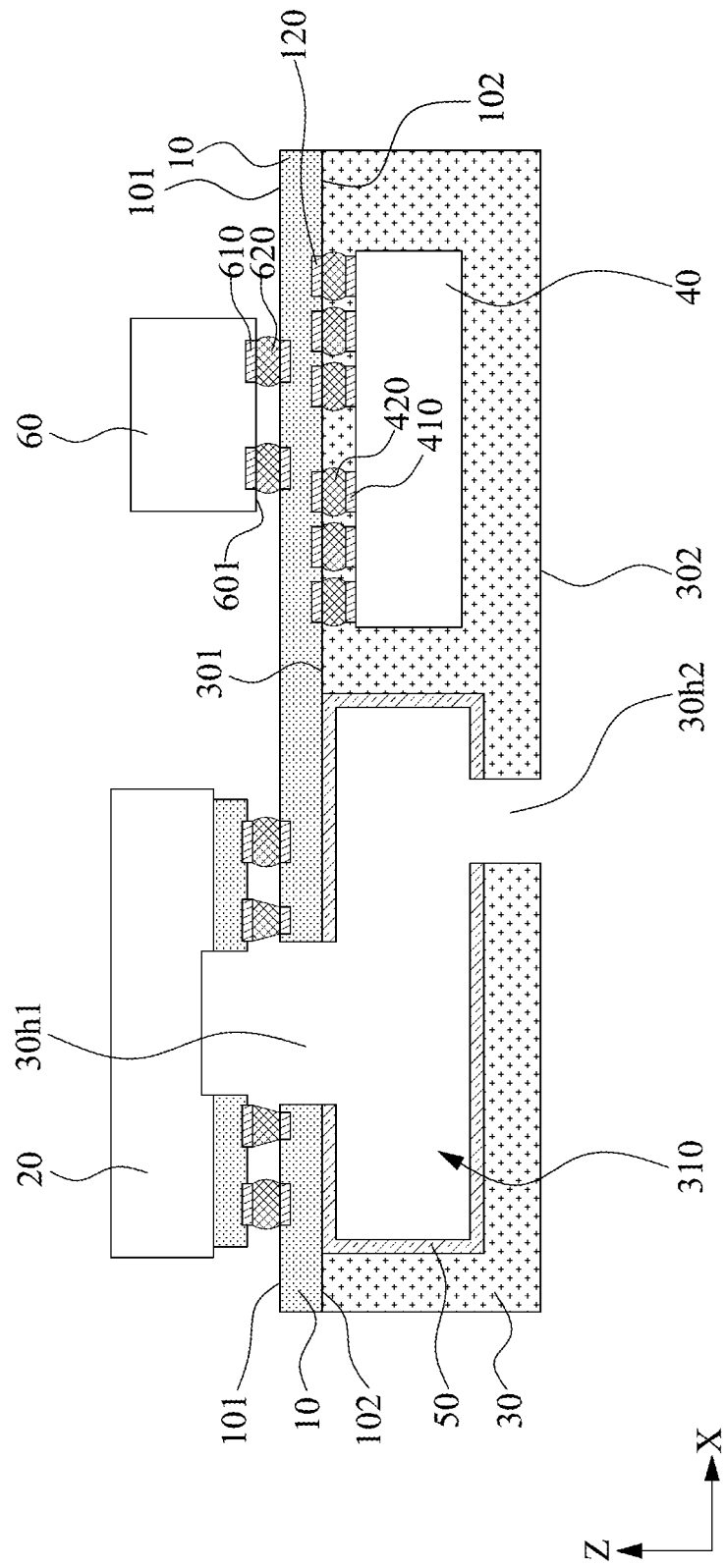

Referring to FIG. 5H, an electronic component 20 (or a MEMS device) and an electronic component 60 are disposed on the surface 101 of the substrate 10. In some embodiments, the electronic components 20 and 60 are disposed after removing the sacrificial layer 500. As such, the semiconductor package device 1 as illustrated in FIG. 1 is formed.

Figure 6:
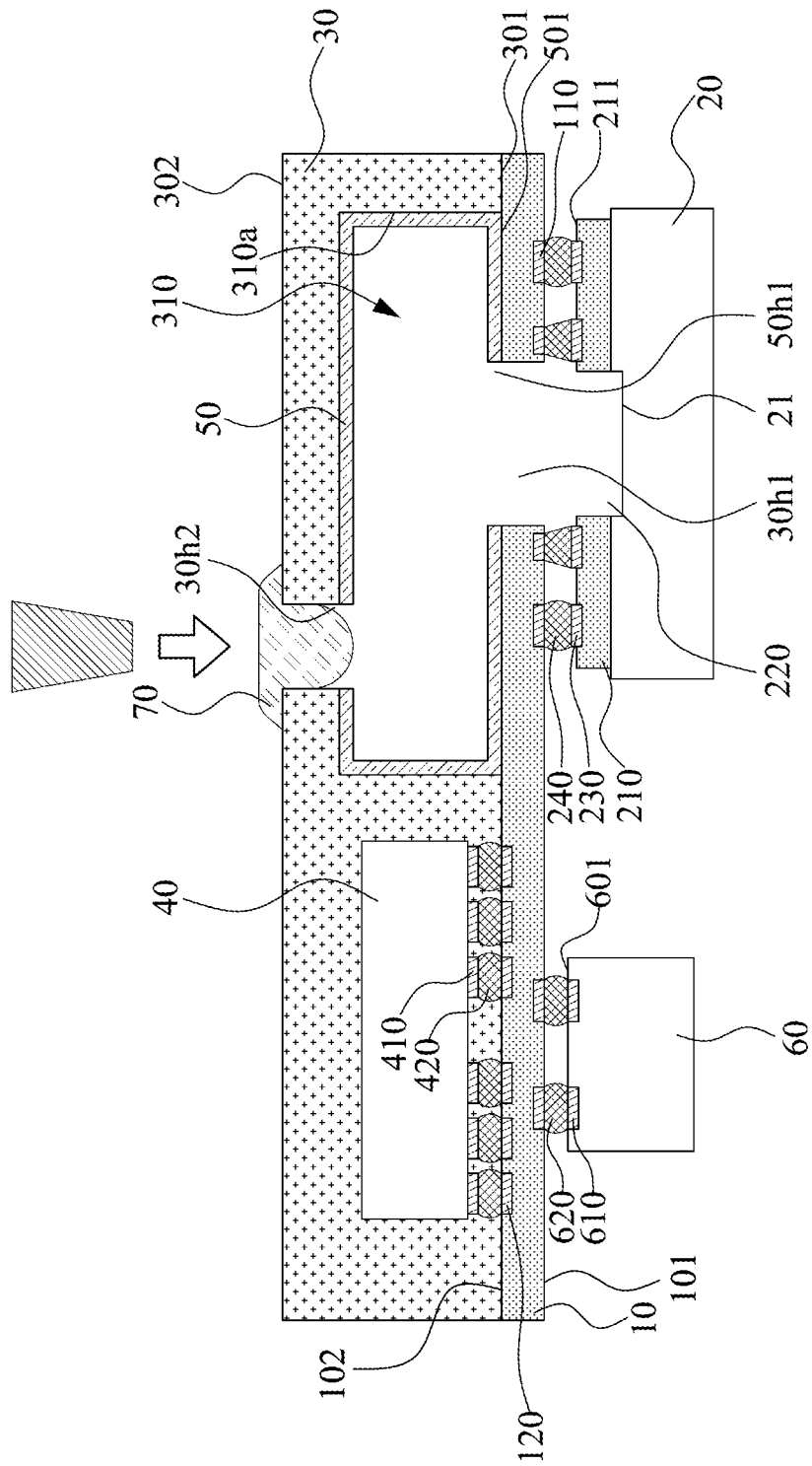
FIG. 6 illustrates one or more operations in a method of manufacturing a semiconductor package device in accordance with some embodiments of the present disclosure.

FIG. 6 illustrates one or more operations in a method of manufacturing a semiconductor package device 3 in accordance with some embodiments of the present disclosure.

Referring to FIG. 6, after operations illustrated in FIGS. 5A-5H are performed, a sealing material 70 is disposed to block the opening 30*h*2 of the encapsulation layer 30. In some embodiments, the sealing material 70 may be or include an encapsulating material. In some embodiments, the sealing material 70 may be formed by dispensing the sealing material 70 over a portion of the surface 302 and within the opening 30*h*2 of the encapsulation layer 30. As such, the semiconductor package device 3 as illustrated in FIG. 3 is formed.

FIG. 7A, FIG. 7B, FIG. 7C, FIG. 7D, FIG. 7E, FIG. 7F, and FIG. 7G illustrate various operations in a method of manufacturing a semiconductor package device 4 in accordance with some embodiments of the present disclosure.

Figure 7A:
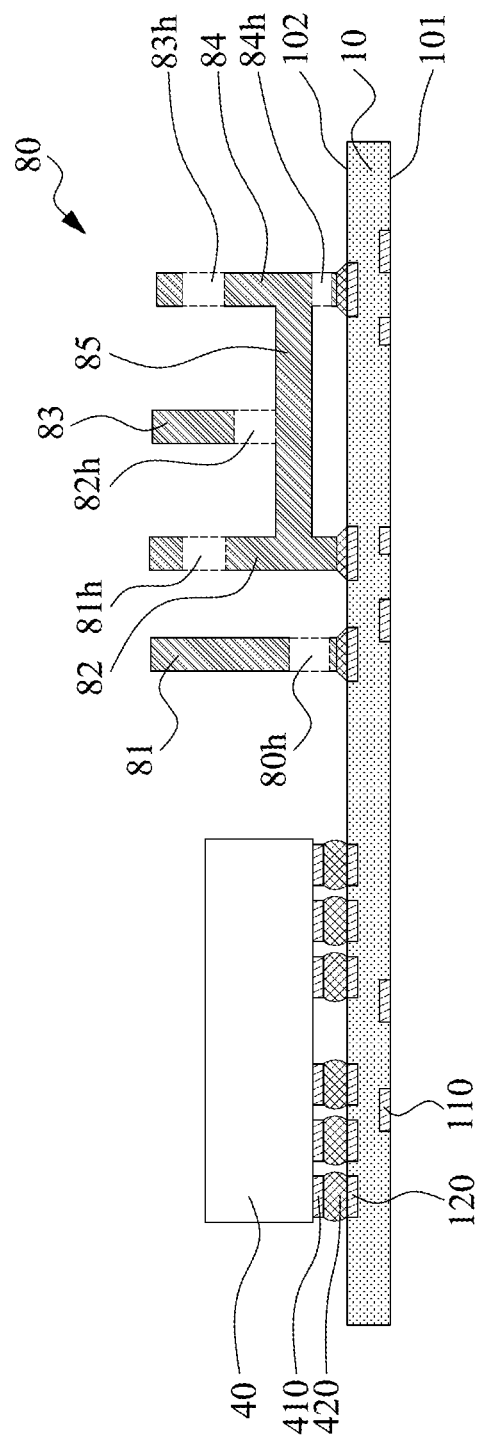
FIG. 7A, FIG. 7B, FIG. 7C, FIG. 7D, FIG. 7E, FIG. 7F, and FIG. 7G illustrate various operations in a method of manufacturing a semiconductor package device in accordance with some embodiments of the present disclosure.

Referring to FIG. 7A, operations similar to those illustrated in FIG. 5A are performed, and a partition structure 80 is disposed on the surface 102 of the substrate 10. In some embodiments, the partition structure 80 is spaced apart from the electronic component 40. In some embodiments, the connection between the partition structure 80 and the substrate 10 may be attained by way of SMT.

Figure 7B:
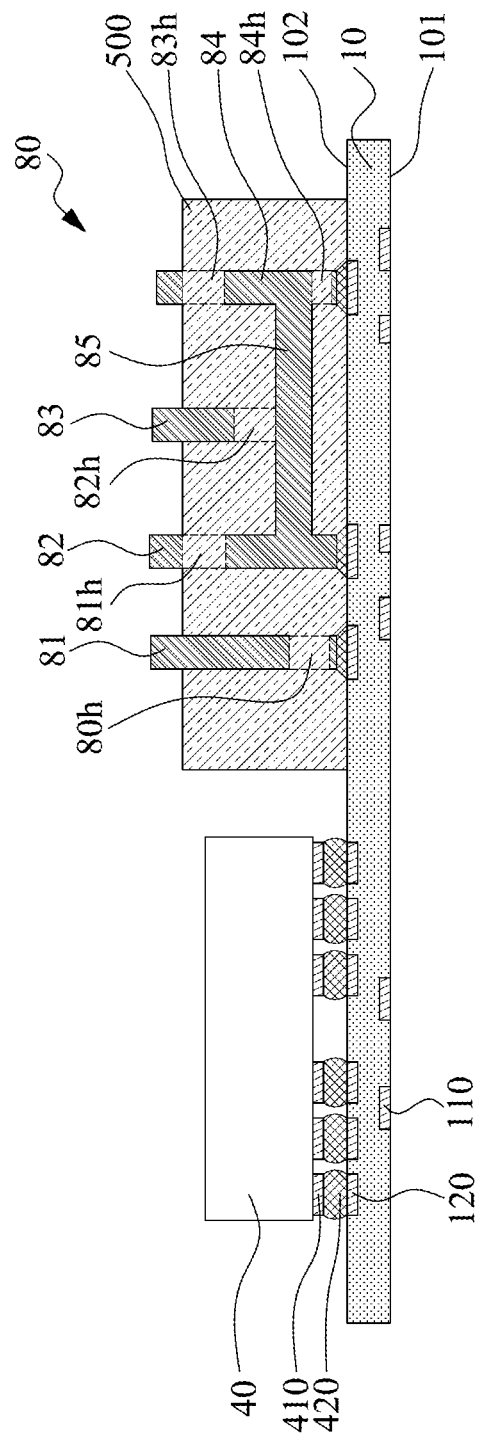

Referring to FIG. 7B, operations similar to those illustrated in FIG. 5B are performed, and the sacrificial layer 500 is further formed on the partition structure 80. In some embodiments, the sacrificial layer 500 partially covers the partition structure 80. In some embodiments, a portion of the partition structure 80 is exposed from the sacrificial layer 500. In some embodiments, a portion of the partition wall 81, a portion of the partition wall 82, a portion of the partition wall 83, and a portion of the partition wall 84 are exposed from the sacrificial layer 500. In some embodiments, the through holes 80*h*, 80*h*1, 80*h*2, 80*h*3 and 80*h*4 are filled with the sacrificial layer 500.

Figure 7C:
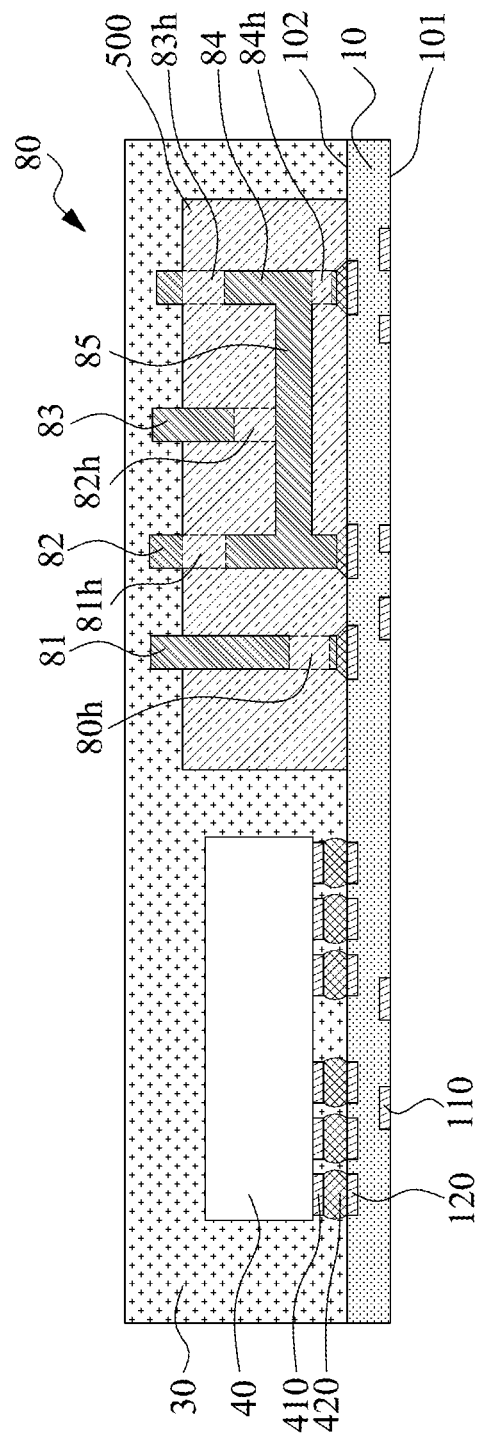

Referring to FIG. 7C, operations similar to those illustrated in FIG. 5C are performed, and the encapsulation layer 30 covers a portion of the partition structure 80. In some embodiments, the encapsulation layer 30 covers the exposed portion of the partition structure 80. In some embodiments, the encapsulation layer 30 covers the exposed portions of the partition walls 81, 82, 83, and 84.

Figure 7D:
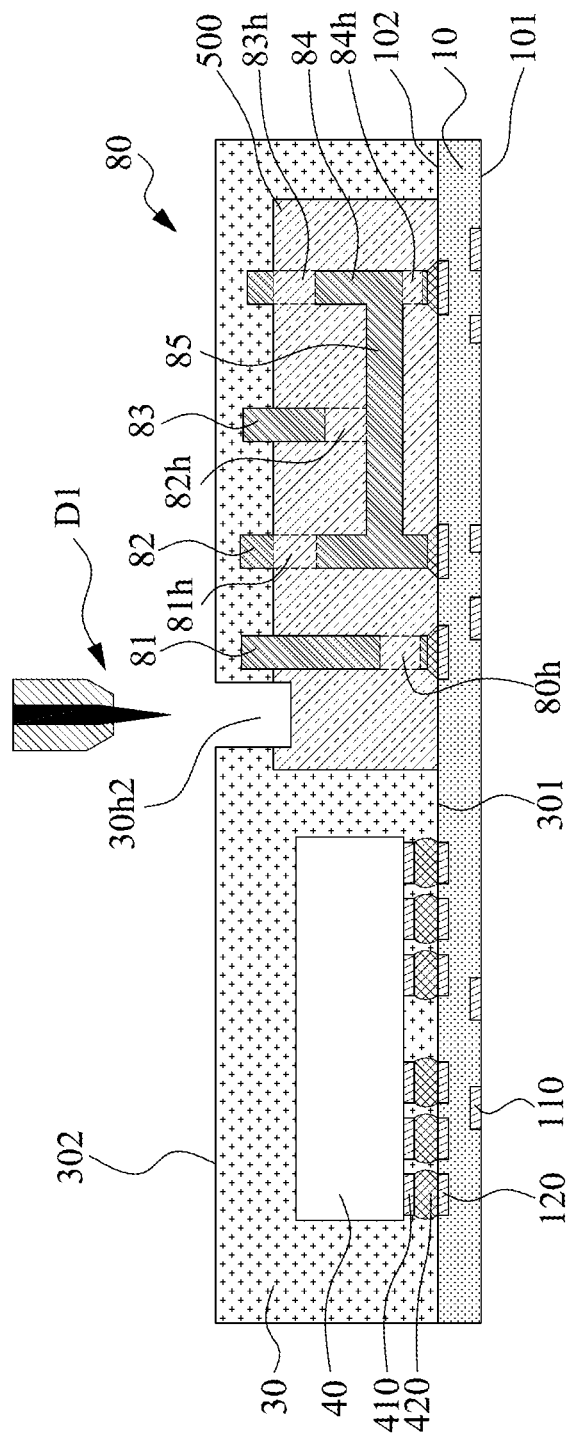

Referring to FIG. 7D, operations similar to those illustrated in FIG. 5D are performed to form an opening 30$h$2 that exposes a portion of the sacrificial layer 500. In some embodiments, the opening 30$h$1 is spaced apart from the partition structure 80.

Figure 7E:
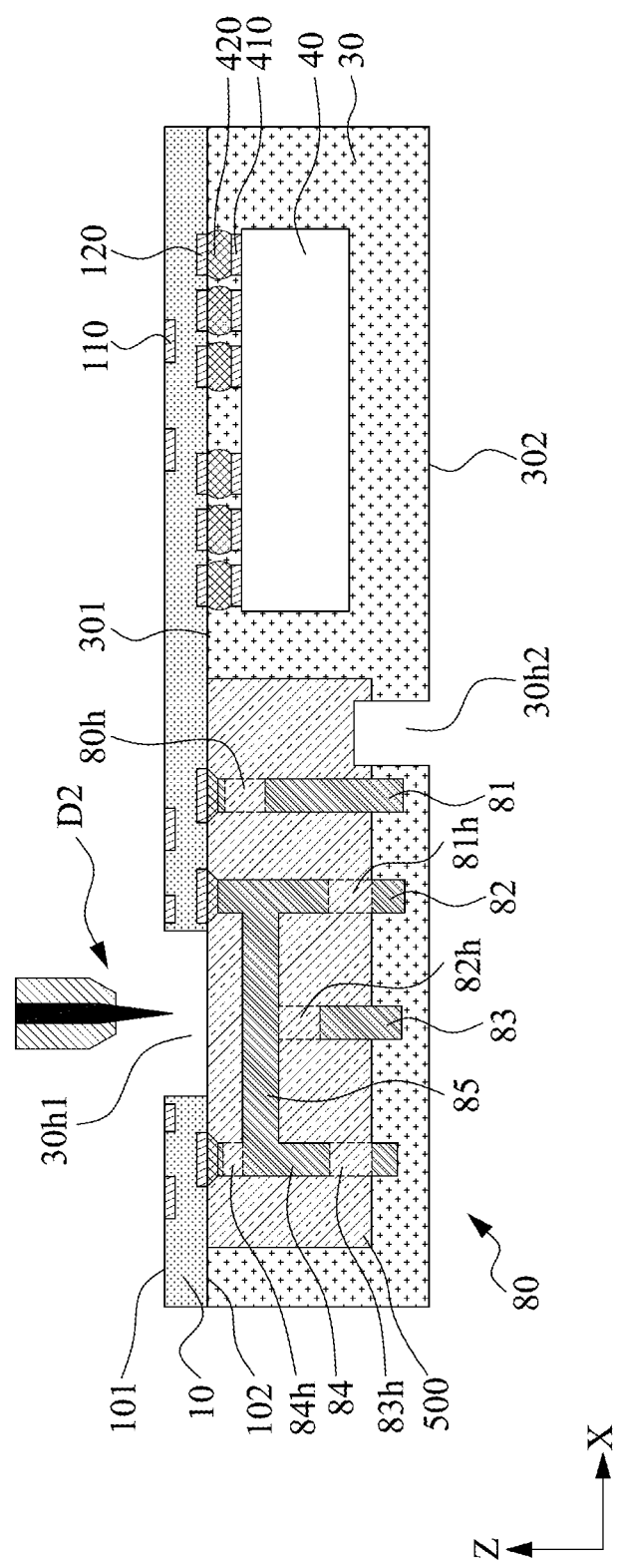

Referring to FIG. 7E, operations similar to those illustrated in FIG. 5E are performed to form an opening 30$h$2 that exposes a portion of the sacrificial layer 500.

Figure 7F:
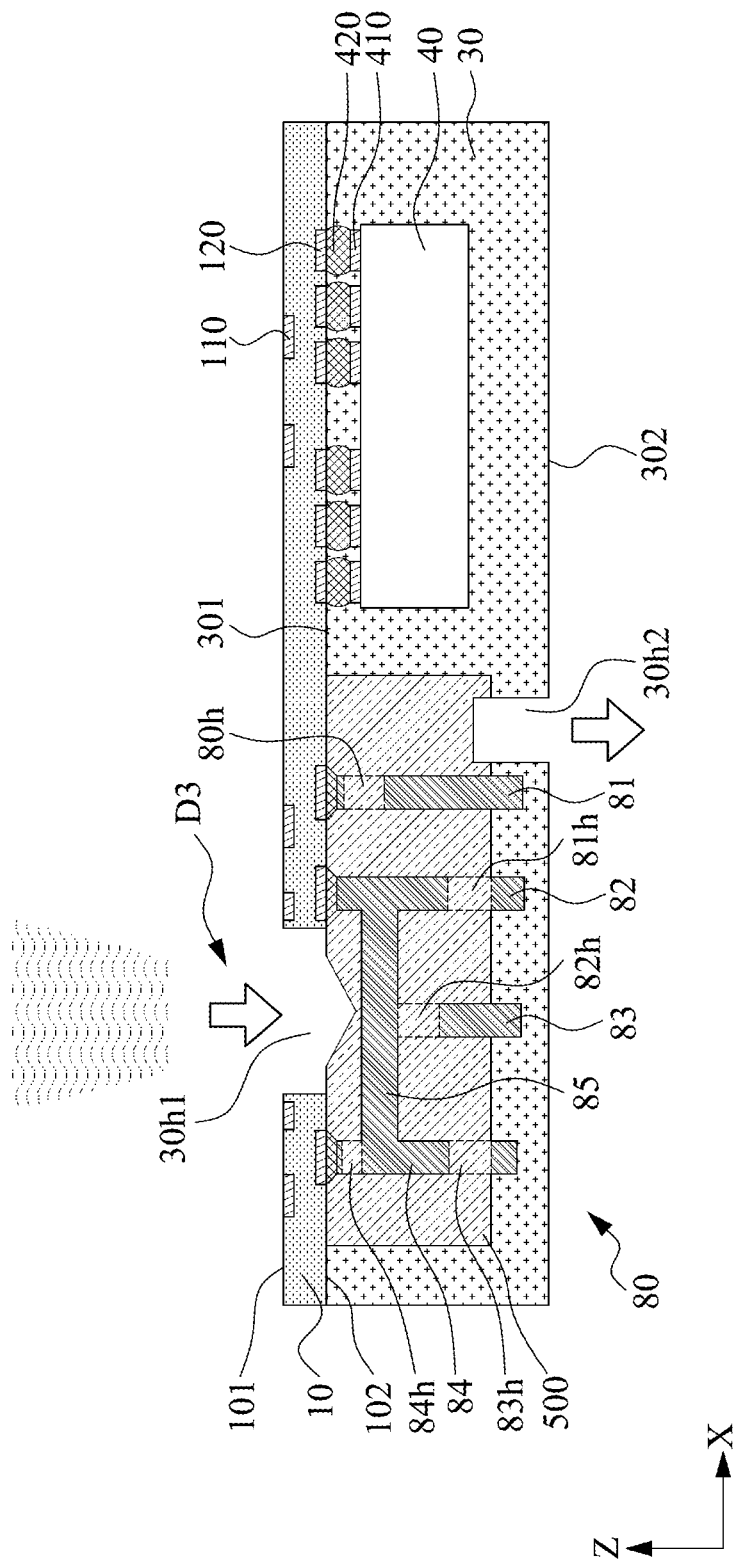

Referring to FIG. 7F, operations similar to those illustrated in FIG. 5F are performed on the sacrificial layer 500 to remove a portion of the sacrificial layer 500.

Figure 7G:
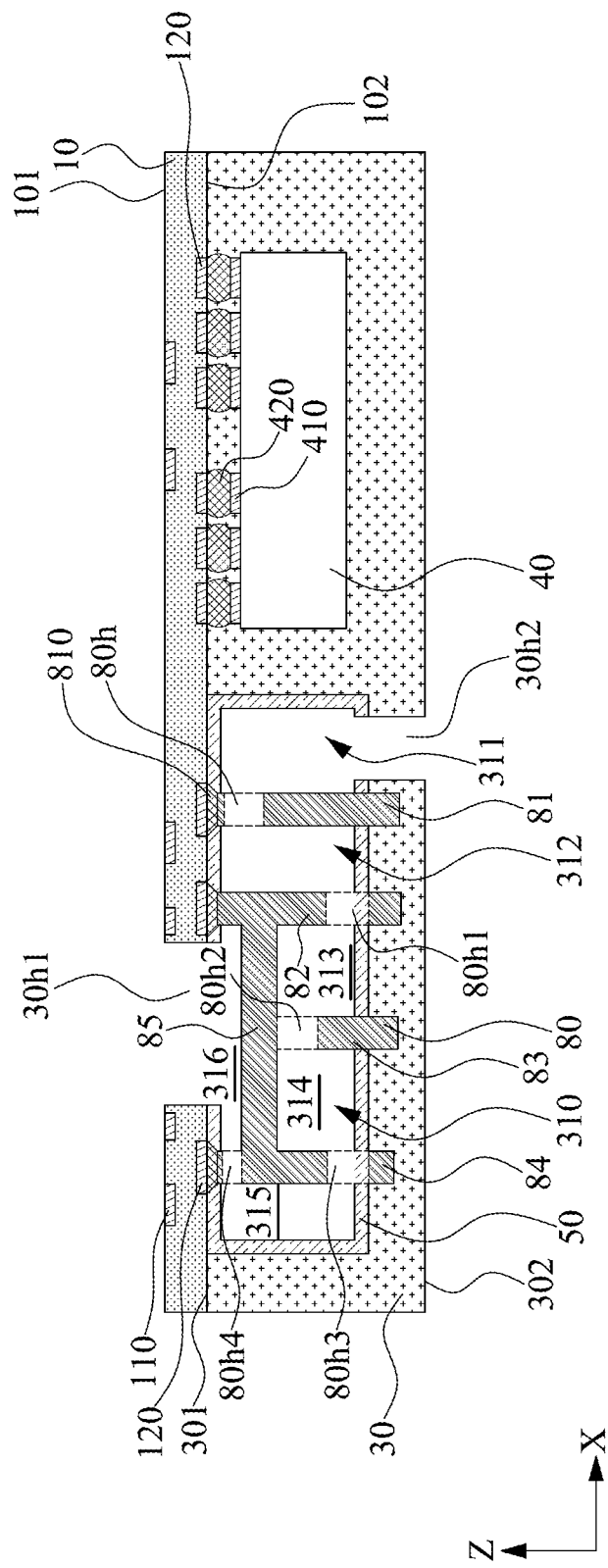

Referring to FIG. 7G, a portion of the sacrificial layer 500 is removed to define a chamber 310 within the encapsulation layer 30. In some embodiments, the chamber 310 is formed, a portion of the sacrificial layer 500 remains on an inner wall 310$a$ of the chamber 310 to form an acoustic absorbing layer 50. In some embodiments, the acoustic absorbing layer 50 may include an uneven thickness. In some embodiments, portions of the sacrificial layer 500 in the through holes 80$h$, 80$h$1, 80$h$2, 80$h$3 and 80$h$4 of the partition structure 80 are completely removed. In some other embodiments, portions of the sacrificial layer 500 in the through holes 80$h$, 80$h$1, 80$h$2, 80$h$3 and 80$h$4 of the partition structure 80 are partially removed, such that the acoustic absorbing layer 50 may be further formed on the inner walls of the through holes 80$h$, 80$h$1, 80$h$2, 80$h$3 and 80$h$4 of the partition structure 80.

Next, referring to FIG. 4, an electronic component 20 (or a MEMS device) and an electronic component 60 are disposed on the surface 101 of the substrate 10. In some embodiments, the electronic components 20 and 60 are disposed after removing the sacrificial layer 500. As such, the semiconductor package device 4 as illustrated in FIG. 4 is formed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package device, comprising:
a substrate having a first surface, a second surface opposite to the first surface, and a first opening extending from the first surface to the second surface;
a first electronic component disposed on the first surface of the substrate;
an encapsulation layer formed on the second surface of the substrate, wherein the encapsulation layer comprises a chamber connected to the first opening, a width of the first opening is smaller than a width of the chamber, and the encapsulation layer has a second opening opposite to the first opening of the substrate and connected to the chamber; and
a partition structure disposed within the chamber and dividing the chamber into at least a first sub-chamber and a second sub-chamber.

2. The semiconductor package device of claim 1, wherein the first electronic component is substantially aligned with the first opening of the substrate.

3. The semiconductor package device of claim 2, wherein a vibration membrane portion of the first electronic component is substantially aligned with the first opening of the substrate.

4. The semiconductor package device of claim 1, wherein a central axis of the first opening is offset from a central axis of the second opening.

5. A semiconductor package device, comprising:
a substrate having a first surface, a second surface opposite to the first surface, and a first opening extending from the first surface to the second surface;
a first electronic component disposed on the first surface of the substrate;
an encapsulation layer formed on the second surface of the substrate, wherein the encapsulation layer comprises a chamber connected to the first opening, a width of the first opening is smaller than a width of the chamber, and the encapsulation layer has a second opening opposite to the first opening of the substrate and connected to the chamber; and
a sealing material blocking the second opening of the encapsulation layer.

6. The semiconductor package device of claim 1, wherein a portion of the partition structure is embedded in the encapsulation layer.

7. The semiconductor package device of claim 1, wherein the partition structure comprises a partition wall having a through hole connecting the first sub-chamber and the second sub-chamber.

8. The semiconductor package device of claim 1, further comprising a second electronic component encapsulated in the encapsulation layer.

9. The semiconductor package device of claim 5, further comprising an acoustic absorbing layer on an inner wall of the chamber.

10. The semiconductor package device of claim 1, wherein the first electronic component is a microelectromechanical system (MEMS) device.

11. A semiconductor package device, comprising:
a substrate having a first surface and a second surface opposite to the first surface;
a MEMS device disposed on the first surface of the substrate and substantially aligned with a first opening extending through the substrate;
an encapsulation layer formed on the second surface of the substrate;
a chamber in the encapsulation layer and connected to the first opening, the chamber being configured to receive a sound wave from the MEMS device through the first opening, wherein the chamber has a second opening distal from the MEMS device and connected to the first opening; and
a sealing material blocking the second opening of the chamber.

12. The semiconductor package device of claim 11, wherein a sidewall of the first opening is non-coplanar to an inner wall of the chamber.

13. The semiconductor package device of claim 11, further comprising a sound wave path lengthening mechanism in the chamber.

14. The semiconductor package device of claim 11, wherein the MEMS device is a speaker.

15. A method for fabricating a semiconductor package device, comprising:
disposing a partition structure on a first surface of a substrate;
forming a sacrificial layer on the first surface of the substrate and partially covering the partition structure, wherein a portion of the partition structure is exposed from the sacrificial layer;
forming an encapsulation layer on the first surface of the substrate and encapsulating the sacrificial layer, wherein the encapsulation layer covers the portion of the partition structure exposed from the sacrificial layer;
exposing the sacrificial layer by forming an opening in the substrate; and
removing a portion of the sacrificial layer to define a chamber within the encapsulation layer, wherein the chamber is divided into at least a first sub-chamber and a second sub-chamber by the partition structure.

16. The method of claim 15, wherein exposing the sacrificial layer comprises forming an opening in the encapsulation layer that exposes a portion of the sacrificial layer.

17. The method of claim 15, further comprising disposing a limit structure on the first surface of the substrate prior to forming the sacrificial layer, and forming the sacrificial layer comprises:
disposing a sacrificial material within a space defined by the limit structure to form the sacrificial layer within the space defined by the limit structure; and
removing the limit structure prior to forming the encapsulation layer.

* * * * *